United States Patent [19]

Capasso et al.

[11] Patent Number: 4,597,165
[45] Date of Patent: Jul. 1, 1986

[54] METHOD OF MAKING INTEGRATED CIRCUITS EMPLOYING ION-BOMBARDED INP LAYERS

[75] Inventors: Federico Capasso, Westfield; Marlin W. Focht, Stewartsville; Albert T. Macrander, Summit; Bertram Schwartz, Westfield, all of N.J.

[73] Assignee: AT&T Bell Laboratories, Murray Hill, N.J.

[21] Appl. No.: 555,671

[22] Filed: Nov. 28, 1983

[51] Int. Cl.$^4$ .................. H01S 3/18; H01L 21/208
[52] U.S. Cl. .................. 29/576 B; 148/1.5; 148/175; 148/DIG. 84; 372/45; 372/46
[58] Field of Search .......... 29/576 B; 148/1.5, 175; 372/45, 46

[56] References Cited

U.S. PATENT DOCUMENTS

| 3,824,133 | 7/1974 | D'Asaro et al. | 148/1.5 |
| 4,233,090 | 11/1980 | Hawrylo | 29/569 L |
| 4,410,994 | 10/1983 | Ota et al. | 372/45 |

FOREIGN PATENT DOCUMENTS 0162893 12/1981 Japan .................. 29/569 L

OTHER PUBLICATIONS

"High Resistivity in P-Type InP by Deuteron Bombardment", *Applied Physics Letters*, vol. 42, No. 11, (Jun. 1, 1983), pp. 970-972, M. W. Focht et al.
"Deuteron Bombardment of Gallium Arsenide for Device Isolation", *IEEE Electron Device Letters*, vol. ED-L-1, No. 5 (1980), p. 72, K. Steeples et al.
"Optical and Electrical Properties of Proton-Bombarded P-Type GaAs", *J. Appl. Phys.*, vol. 44, No. 1, Jan. 1973, p. 207, J. C. Dyment et al.
"Proton Bombardment in InP", *Solid-State Electronics*, vol. 20, (1977), pp. 727-730, J. P. Donnelly et al.
"The Electrical Characteristics of Ion Implanted Compound Semiconductors", *Nuclear Instruments and Methods*, (1981), pp. 553-571, J. P. Donnelly et al.
"Annealing of Defects in Ion-Bombarded Indium Antimonide", *Sov. Phys. Semicond.*, vol. 11, No. 7, (Jul. 1977), pp. 798-800, V. A. Bogatyrev et al.
"Electrical Properties of Proton and Helium Ion Bombarded GaAs", *Report on Research Applications*, 24(2) (1975), H. Harada et al.
"Compensation of N-Type GaAs by Proton Bombardment", *Second International Conference Ion Implantation in Semiconductors*, Springer-Verlag, Berlin 1971, pp. 212-221, B. R. Pruniaux et al.
Hsieh et al., Appl. Phys. Letts. 28 (1976), 709.

*Primary Examiner*—Upendra Roy
*Attorney, Agent, or Firm*—Michael J. Urbano

[57] ABSTRACT

The property of materials in the InP system, whereby helium ion or deuteron bombarded p-type material becomes highly resistive but n-type material remains relatively conductive, is utilized to fabricate integrated circuits which include buried semiconductor interconnections or bus bars between devices.

6 Claims, 5 Drawing Figures

METHOD OF MAKING INTEGRATED CIRCUITS EMPLOYING ION-BOMBARDED InP LAYERS

CROSS-REFERENCE TO RELATED APPLICATIONS

This application was concurrently filed with the following applications: P. J. Anthony, R. L. Hartman, L. A. Koszi and B. Schwartz, Ser. No. 555,506 (now U.S. Pat. No. 4,539,743 issued on Sept. 10, 1985) entitled "The Production of Semiconductor Devices With Buried Resistive Regions by Controlled Ion Bombardment and Heat Treatment," and M. W. Focht, L. A. Koszi and B. Schwartz, Ser. No. 555,670 entitled "Integrated Circuits Employing Proton-Bombarded AlGaAs Layers."

BACKGROUND OF THE INVENTION

This invention relates to a technique for fabricating InP semiconductor structures having juxtaposed high and low resistivity regions and, more particularly, to integrated circuits in which buried interconnections are realized using such structures.

Integrated circuits typically include a plurality of devices (e.g., components or circuits) formed in a single semiconductor wafer. The devices may be electrically isolated from one another by a variety of techniques: p-n junction isolation, etched-groove isolation, or oxide channel isolation, for example. Metallization patterns on the surface of the wafer are used to address selected devices or to interconnect them to one another. Generally speaking, however, the interconnection and/or addressing of devices does not involve buried semiconductor channels to achieve these functions.

SUMMARY OF THE INVENTION

In accordance with our invention, we advantageously exploit a differential resistivity property of InP-containing materials which are subjected to deuteron or helium ion bombardment. More specifically, over a broad dosage range the peak resistivity of helium bombarded p-type material is nearly six orders of magnitude greater than that of n-type material, and the peak resistivity of deuteron bombarded p-type material is about nine orders of magnitude greater than that of n-type material. These characteristics allow buried semiconductor interconnections and buried semiconductor bus bars to be realized by building into an integrated circuit alternating n-type and p-type layers and utilizing different bombardment doses and energies to render selected p-type layers highly resistive while n-type layers remain highly conductive or become considerably less resistive. The bombarded p-type layers can be used to electrically isolate devices from one another or to define the boundaries of n-type layers used as buried interconnections or bus bars.

BRIEF DESCRIPTION OF THE DRAWING

Our invention, together with its various features and advantages, can be readily understood from the following more detailed description taken in conjunction with the accompanying drawing, in which the figures have not been drawn to scale in the interests of clarity.

DETAILED DESCRIPTION

Figure 1:
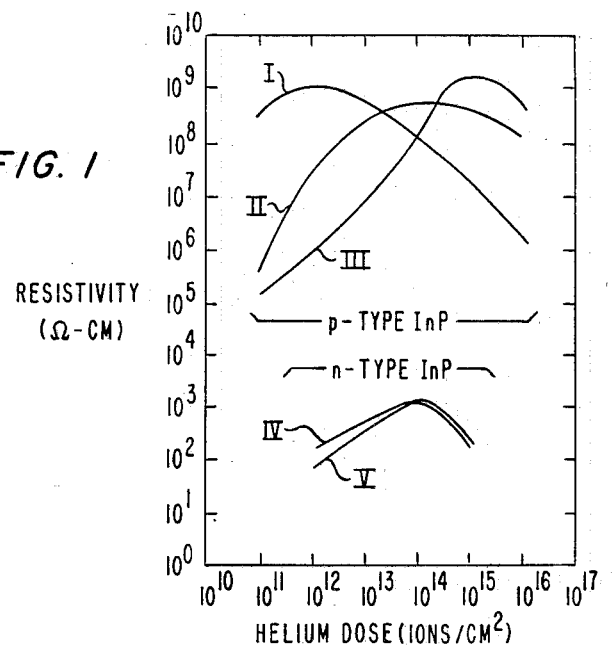
FIG. 1 is a graph of resistivity versus helium ion dose for n-type and p-type InP: Curve I is for p-InP doped to a carrier concentration of $8.7 \times 10^{17}/cm^3$ and bombarded with $^3$He ions, Curve II is for p-InP doped to a carrier concentration of $6.3 \times 10^{18}/cm^3$ and bombarded with $^3$He ions, Curve III is for p-InP doped to a carrier concentration of $6.3 \times 10^{18}/cm^3$ and bombarded with $^4$He ions, Curve IV is for n-InP doped to a carrier concentration of $1.8 \times 10^{18}/cm^3$ and bombarded with $^4$He ions, and Curve V is for n-InP doped to a carrier concentration of $1.8 \times 10^{18}/cm^3$ and bombarded with $^3$He ions.

With reference now to FIG. 1, there is shown a graph of average resistivity versus helium ion bombardment dose for n-type InP and p-type InP. See copending application Ser. No. 499,775 (L. C. Feldman et al) filed on May 31, 1983 (now abandoned), and assigned to the assignee hereof. The ions utilized to generate the five curves were singly ionized species of either $^4$He (Curves III and IV) or $^3$He (Curves I, II and V) at energies of 200, 250 or 275 keV. The primary characteristic of helium bombarded InP which is advantageously exploited in accordance with our invention is evident from the high resistivity grouping of Curves I, II and III for p-type InP in contrast with the low resistivity grouping of curves IV and V for n-type InP. More specifically, the resistivity of p-type InP is approximately $10^8$–$10^9$ ohm-cm at a dose $1 \times 10^{14}/cm^2$, whereas the peak resistivity for n-type InP is approximately $10^3$ ohm-cm, approximately six orders of magnitude lower. In addition, the resistivity ratio can be made even larger by choosing different doses. For example, at a $^3$He dose of $1 \times 10^{12}/cm^2$ n-type InP has an even lower resistivity of $10^2$ ohm-cm (Curve V), whereas p-type InP reaches a peak resistivity of $10^9$ ohm-cm (Curve I). Thus, the resistivity ratio is $10^7$. Similar comments apply at doses of $1 \times 10^{15}/cm^2$ when comparing $^4$He bombardment (Curves III and IV). Moreover, a similar phenomenon occurs when InP is bombarded with deuterons. As shown by Curve VI of FIG. 2, p-type InP becomes highly resistive ($10^6$–$10^9$ ohm-cm) over a broad range of doses ($10^{13}$–$10^{16}/cm^2$). See M. W. Focht et al, *Applied Physics Letters*, Vol. 42, No. 11, p. 970 (June 1, 1983). In contrast, n-type InP type does not exhibit an increase in resistivity; i.e., it remains highly conductive and, so, the area below line VII has been labeled n-type InP.

As a consequence, in a multilayered structure containing both n-type and p-type layers, over a wide range of helium ion or deuteron doses selected p-type InP layers can be made highly resistive, whereas n-type InP layers either remain highly conductive (the deuteron case) or become six to seven orders magnitude less resistive (the helium case). Further selectivity can be attained by appropriate choice of the energy of the ions which typically penetrate into InP to a depth of approximately 0.9–1.7 $\mu$m for 150–300 keV helium ions. Deuterons, on the other hand, penetrate about 0.9 $\mu$m for each 100 keV. That is, for example, a helium ion energy of 300 keV produces an approximately Gaussian distribution of helium ions in the semiconductor with the peak of the distribution occurring at a depth of approximately 1.7 μm into the bombarded material. Similarly, helium bombardment at 150 keV would produce a corresponding peak at a depth of about 0.9 μm. Accordingly, multiple bombardments at different energies can be performed sequentially in order to produce a more nearly uniform distribution of resistivity.

Figure 2:
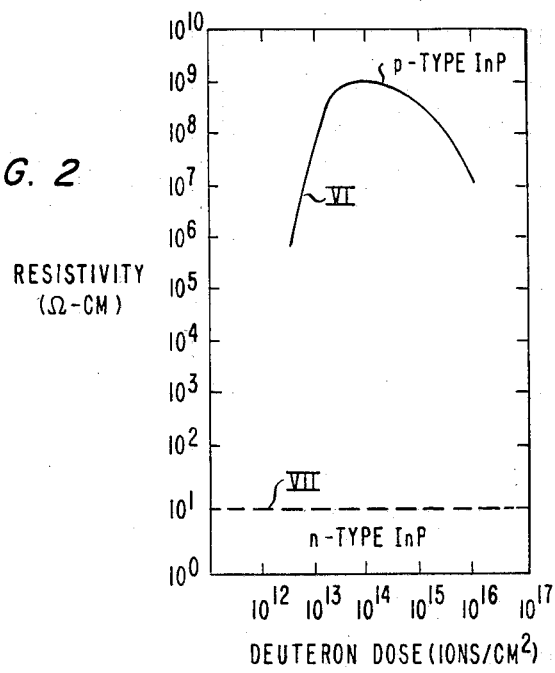
FIG. 2 is a graph of resistivity versus deuteron dose for n-type ($\sim 5$–$9 \times 10^{18}/cm^3$) and p-type ($\sim 1 \times 10^{18}/cm^3$) InP.

The general profiles shown in FIGS. 1 and 2 are believed to be applicable to other Group III-V compounds containing InP (e.g., InGaAsP) as well as to a variety of n-type dopants (e.g., Sn, S), p-type dopants (e.g., Zn, Cd), and a range of dopant concentrations. But, in the latter instance, higher concentrations typically require a higher ion dose to attain the same resistivity level.

Figure 3:
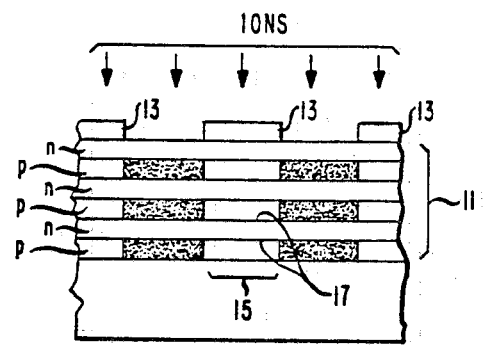
FIG. 3 is a schematic showing how a helium or deuteron-bombarded, multilayered structure results in selected p-type layers becoming highly resistive.

In accordance with our invention, therefore, a structure of the type shown in FIG. 3, which includes alternating layers 11 of n-type and p-type InP, is helium ion or deuteron bombarded at an energy and dose so that the n-type InP layers remain either highly conductive (the deuteron case) or become lowly resistive (the helium case), whereas the p-type InP layers become highly resistive. Moreover, a patterned mask 13 may be used to form device channels 15, including p-n junctions 17, which are integrally connected to the low resistivity n-type layers. In this fashion, the n-type InP layers may be utilized as buried semiconductor interconnections or buried semiconductor bus bars which connect separated devices of an integrated circuit.

Figure 4:
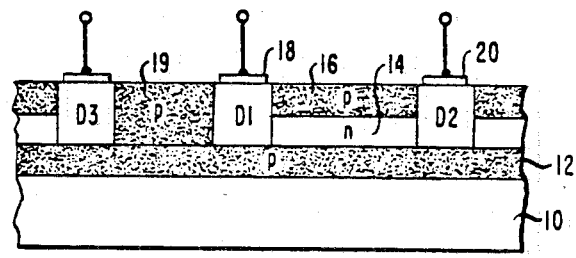
FIG. 4 is a schematic of an integrated circuit using a n-InP layer as a buried interconnection in accordance with one embodiment of our invention.

One embodiment of our invention utilizing a buried semiconductor interconnection is shown schematically in FIG. 4. This integrated circuit includes a substrate 10 on which is formed a highly resistive p-InP layer 12. A set of devices D1, D2 and D3 are formed on the layer 12 by any suitable fabrication technique well known in the art. The devices may be identical to one another (e.g., transistor memory cells) or they may be different from one another (e.g., a laser and an FET driver in an optical integrated circuit). The devices D1 and D3 are electrically isolated from one another by a high resistivity p-InP layer 19, whereas D1 and D2 are electrically connected to one another via a low resistivity n-InP layer 14. A highly resistive p-InP layer 16 is formed on top of layer 14 and preferably is grown to a thickness which renders the top surface of the overall structure planar. Thus, the devices D1, D2 and D3 are partially embedded in the semiconductor body formed by layers 12, 14, 16 and 19. Of course, these devices could be fully embedded depending on the particular application. The high resistivity of the p-InP layers 12 and 16 is effective to electrically isolate the devices D1 and D2 from one another except for the conductive path provided by the low resistivity layer 14. Electrical signals are communicated between the devices D1 and D2 through the layer 14 which, therefore, serves as a buried interconnection. Contacts 18 and 20 on the top of devices D1 and D2, respectively, permit interconnection to the outside world.

The portion of the structure of FIG. 4 associated with D1 and D2 may be fabricated in accordance with the following illustrative sequence of process steps. Using a well-known epitaxial growth technique (such as LPE, MBE or CVD), three epitaxial layers, 12, 14, and 16 of p-InP, n-InP and p-InP, respectively, are grown on a single crystal substrate 10. Alternatively, these layers may be formed by localized ion implantation and/or diffusion. The three layers are then subjected to one or more helium ion or deuteron bombardments at a dose in the range of approximately $10^{12}$–$10^{15}$/cm$^2$, thereby rendering the p-InP layers 12 and 16 highly resistive (e.g., $10^8$–$10^9$ ohm-cm) but leaving the n-InP layer 14 highly conductive or lowly resistive. Depending upon the thickness of the layers 12, 14, and 16, it may be desirable to utilize multiple ion bombardments at different energies in order to render both layers 12 and 16, which are at different depths, highly resistive. Moreover, in the event that the device is so thick that layer 12 cannot be reached by ions at the highest energy available from the implantation machine, then it is possible to bombard layer 12 prior to growing layers 14 and 16. This procedure may not be preferred, however, because it complicates the processing sequence, and also because epitaxial growth on the bombarded surface of layer 12 may be difficult. Once the three layers have been ion bombarded so that layers 12 and 16 are highly resistive, the devices D1 and D2 are formed. The fabrication of these devices may entail standard processing techniques such as the etching of a channel through layers 14 and 16 and subsequent epitaxial regrowth of layers (not shown) which constitute each of the devices. Illustratively, the layers grown in such a channel would form suitable p-n junctions depending upon the specific device design. Alternatively, the devices D1 and D2 may be formed in layers 14 and 16 by suitable masking of the device regions from helium ion or deuteron bombardment and subsequent diffusion or implantation of dopants therein. Of course, a combination of these techniques may also be used. Although each of the devices D1 and D2 is shown schematically as occupying the area of a rectangle, the precise geometry depends upon both the processing technique utilized and the device design. Thus, for example, the devices may be formed in V-grooves which can be etched in Group III-V compound semiconductors as is well known in the art. In a similar fashion, the portion of the structure associated with devices D1 and D3 may be fabricated.

Figure 5:
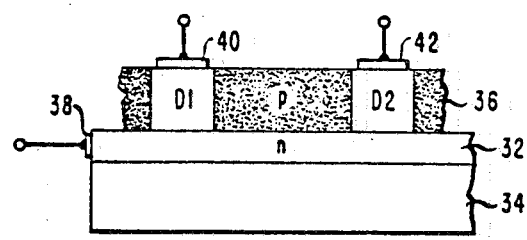
FIG. 5 is a schematic of an integrated circuit using a n-InP layer as a buried bus bar in accordance with another embodiment of our invention.

An alternative embodiment of our invention is depicted in FIG. 5 which demonstrates how a buried semiconductor bus bar may be utilized to interconnect the devices in an array (e.g., a semiconductor memory). A highly conductive n-InP layer 32 is epitaxially grown on a single crystal substrate 34 (e.g., on a semi-insulating Fe-doped InP substrate). A pair of devices D1 and D2 are formed on layer 32 and are isolated from one another by a highly resistive helium ion or deuteron bombarded p-InP layer 36. Thus, devices D1 and D2 are once again at least partially embedded in the semiconductor body formed by layers 32 and 36, and the thicknesses of the devices and layer 36 are adapted to produce a planar structure. As in a semiconductor memory, device D1 would be selectively operated by applying a suitable electrical signal between contact 38 on layer 32, which serves as a bus bar, and contact 40 on the top of device D1. In a similar fashion, device D2 would be selectively operated by applying a signal between contact 38 and contact 42.

The structure of FIG. 5 may be fabricated by the following illustrative sequence of processing steps. Layers 32 and 36 are epitaxially grown on a semi-insulating single crystal substrate 34 of InP. The p-InP layer 36 is then subjected to one or more ion bombardments at a dose in the range of $10^{12}$–$10^{15}$/cm$^2$, thereby rendering layer 36 highly resistive (e.g., $10^8$–$10^9$ ohms-cm). The energies of the bombardments are chosen so as to create high resistivity throughout the thickness of layer 36. Although layer 32 would not generally be ion bombarded, it is difficult to control precisely the maximum depth at which high resistivity will occur. That is, because of the Gaussian nature of the damage distribution produced by the ions, it would be likely that the surface portion of n-InP layer 32 adjacent layer 36 would experience some ion bombardment. But, over a broad range of doses only the p-type InP layer 36 will be rendered highly resistive. After the ion bombardment step is completed, the devices D1 and D2 are formed in layer 36 by any of the techniques described with reference to FIG. 3.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the structures of FIGS. 4 and 5 may involve different processing sequences such that the devices D1 and D2 are formed before the ion bombardment of layers 14 and 16 of FIG. 3 or the ion bombardment of layers 32 and 36 of FIG. 5. In such cases, it may be desirable too suitably mask the top surfaces of the devices D1 and D2 in the event that the ion bombardment might adversely affect the characteristics or performance of the devices.

What is claimed is:

1. A method of manufacturing a device comprising the steps of
   (a) providing a multilayered structure having n-type and p-type Group III–V compound layers which contain InP, and
   (b) bombarding at least one of said n-type layers and one of said p-type layers with ions at a dose and energy so that only said at least one p-type layer becomes highly resistive, said ions being selected from the group consisting of helium ions and deuterons.

2. A method of claim 1 wherein said bombarding step (b) is performed at a dose in the range of approximately $10^{12}$–$10^{15}$/cm$^2$.

3. The method of claim 1 including, between steps (a) and (b), the additional step of forming a patterned mask on a surface of said structure, and wherein said bombarding step (b) takes place through the openings of said mask.

4. A method of manufacturing an integrated circuit comprising the steps of
   (a) providing a multilayered structure having layers of n-type and p-type Group III–V compound semiconductor material which contain InP,
   (b) bombarding at least one of said n-type layers and one of said p-type layers with ions at a dose and energy so that only said at least one p-type layer becomes highly resistive, said ions being selected from the group consisting of helium ions and deuterons, and
   (c) forming at least two separated devices in said structure so that said highly resistive p-type layer electrically isolates said devices from one another and said at least one n-type layer forms a relatively conductive path between said devices.

5. The method of claim 4 wherein
   step (a) includes providing a structure comprising a relatively conductive n-type layer sandwiched between a pair of high resistivity p-type layers,
   step (b) renders said pair of p-type layers highly resistive but leaves said n-type layer relatively conductive, and
   step (c) at least partially embeds said devices in said layers so that said pair of p-type layers bound said n-type layer which forms said conductive path between said devices.

6. The method of claim 4 wherein said devices are at least partially embedded in said at least one p-type layer and are formed upon said at least one n-type layer which forms a buried bus bar connecting said devices to one another.

* * * * *